(12) United States Patent
Pang et al.

(10) Patent No.: US 9,466,369 B1
(45) Date of Patent: Oct. 11, 2016

(54) WORD LINE-DEPENDENT RAMPING OF PASS VOLTAGE AND PROGRAM VOLTAGE FOR THREE-DIMENSIONAL MEMORY

(71) Applicant: SanDisk Technologies Inc., Plano, TX (US)

(72) Inventors: Liang Pang, Fremont, CA (US); Jiahui Yuan, Fremont, CA (US); Yingda Dong, San Jose, CA (US); Jingjian Ren, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 14/976,107

(22) Filed: Dec. 21, 2015

(51) Int. Cl.
*G11C 16/04* (2006.01)
*G11C 16/10* (2006.01)
*G11C 16/34* (2006.01)

(52) U.S. Cl.
CPC ........... *G11C 16/0483* (2013.01); *G11C 16/10* (2013.01); *G11C 16/3427* (2013.01)

(58) Field of Classification Search
USPC ............. 365/185.17, 185.19, 185.22, 185.24
See application file for complete search history.

(56) References Cited

U.S. PATENT DOCUMENTS

| | | | |
|---|---|---|---|
| 7,436,709 B2 | 10/2008 | Higashitani | |
| 8,526,233 B2 | 9/2013 | Hemink et al. | |
| 8,982,626 B2 | 3/2015 | Dong et al. | |
| 2008/0068883 A1* | 3/2008 | Kang | G11C 11/5628 365/185.03 |
| 2009/0287879 A1* | 11/2009 | Oh | G11C 16/0483 711/103 |
| 2013/0242667 A1 | 9/2013 | Shim et al. | |

* cited by examiner

*Primary Examiner* — Vu Le
(74) *Attorney, Agent, or Firm* — Vierra Magen Marcus LLP

(57) ABSTRACT

Techniques are provided for programming a three-dimensional memory device while minimizing over-programming and program disturb. When a selected word line is at the source-side of a set of word lines, a channel gradient is created in the channel adjacent to the selected word line when a program voltage is applied. The gradient generates hot carriers which can cause over-programming of memory cells connected to the selected word line. To reduce the amount of hot carriers, a ramp rate and/or duration of a first step up of the program voltage is reduced. When the selected word line is not at the source-side of the set of word lines, a baseline ramp rate and/or duration can be used. A ramp rate and/or duration of the voltage applied to unselected word lines can be reduced as well but by a lesser amount.

21 Claims, 16 Drawing Sheets

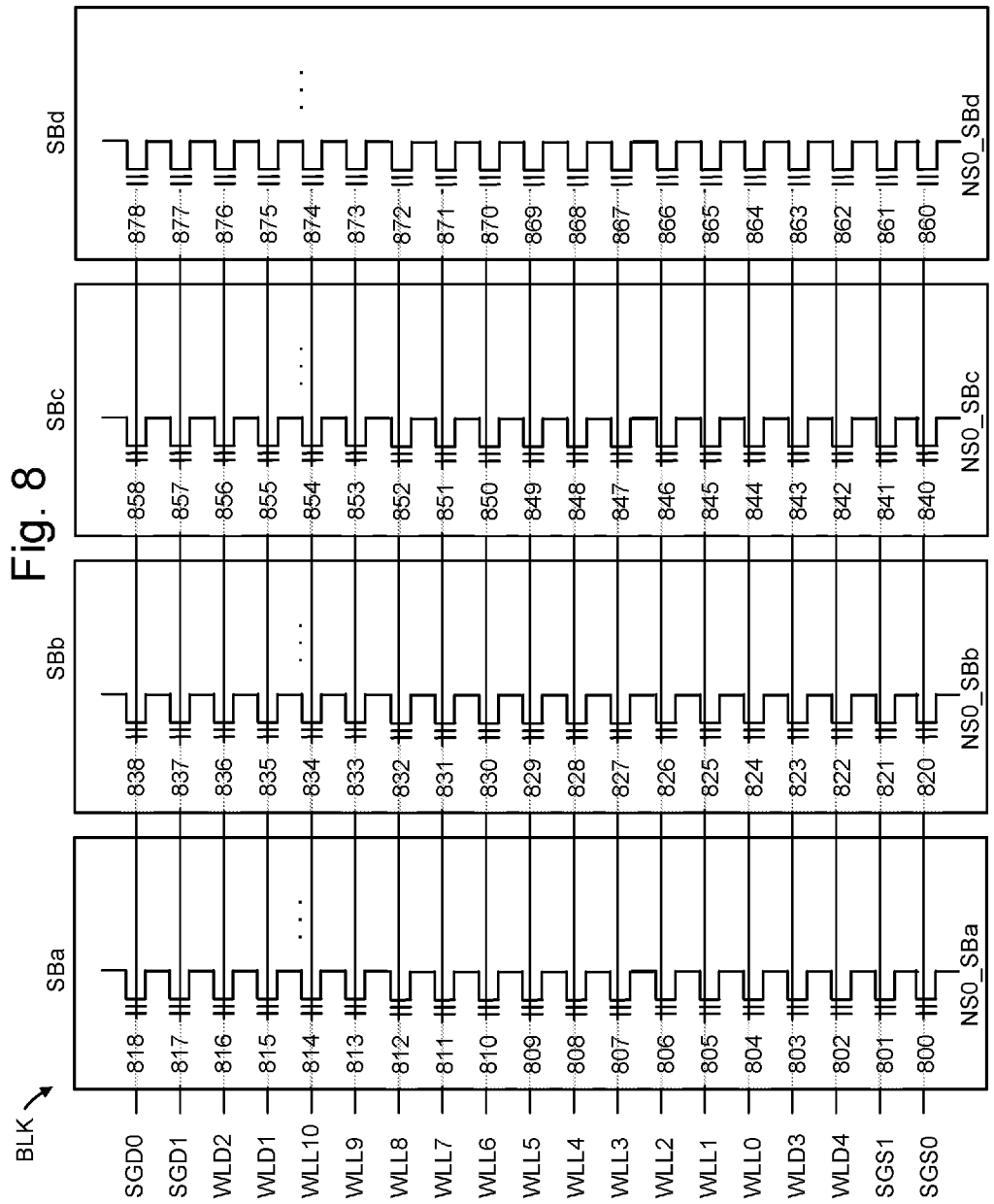

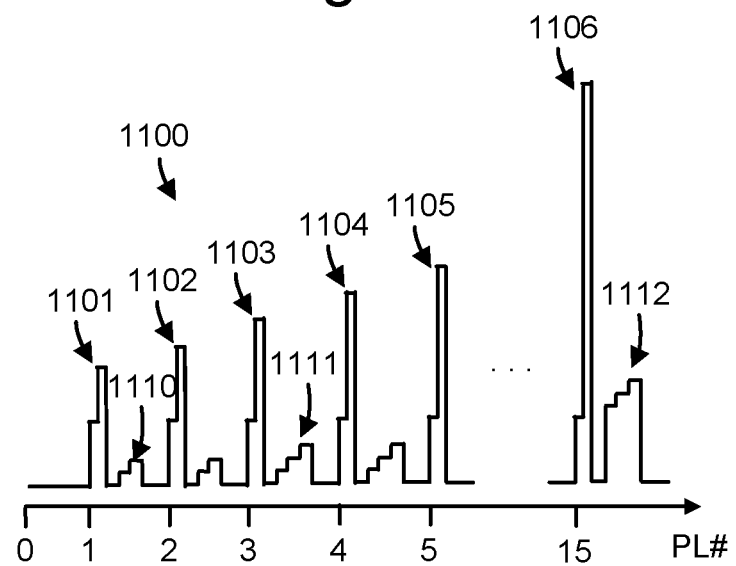

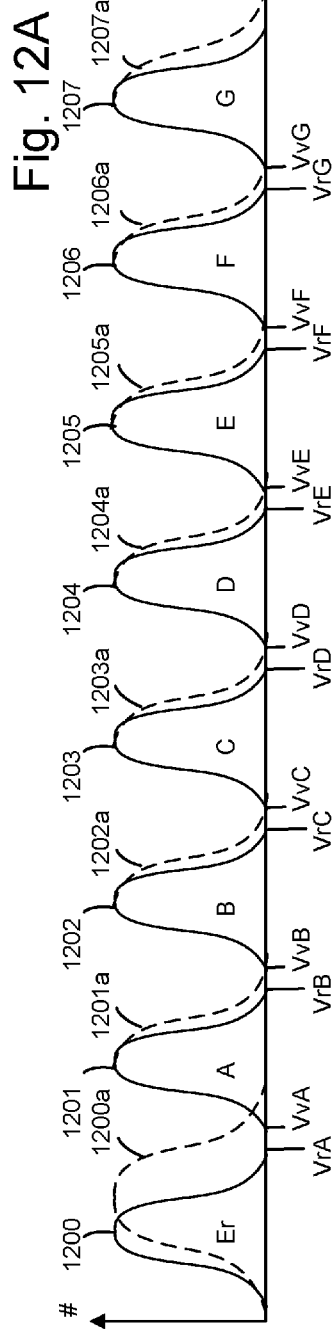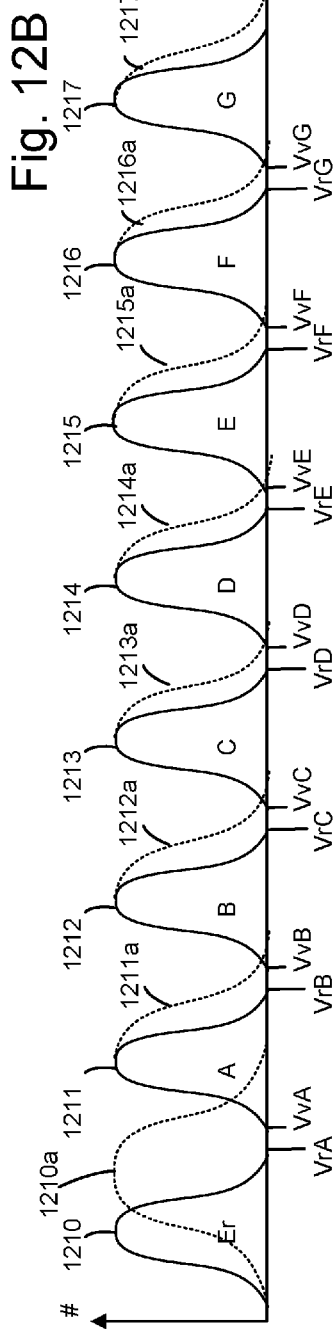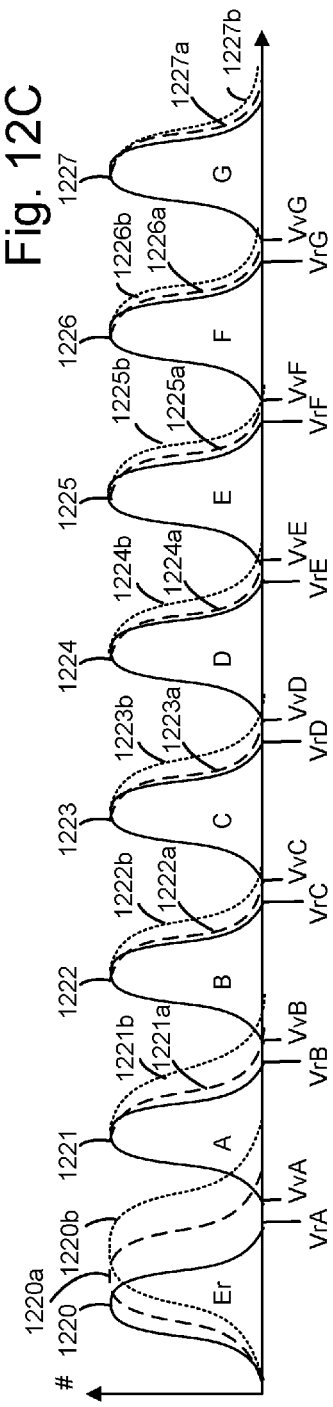

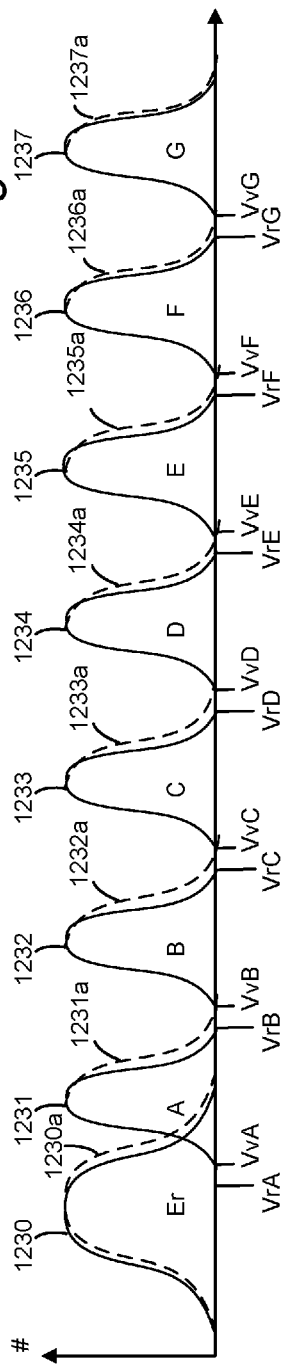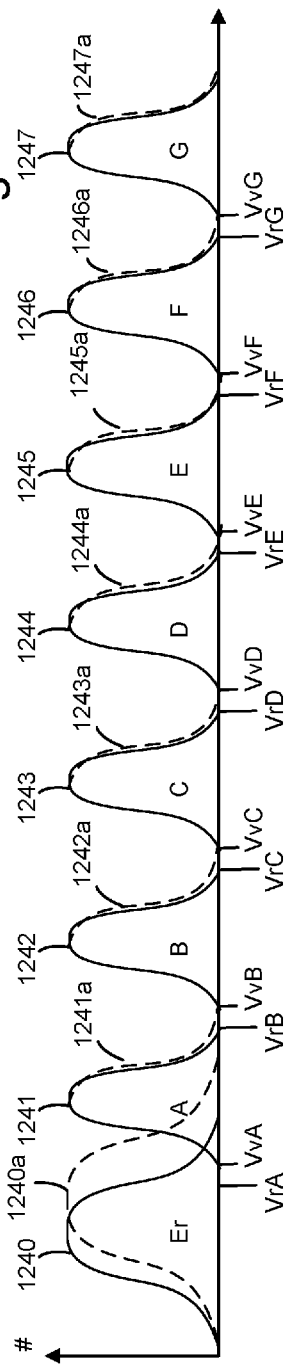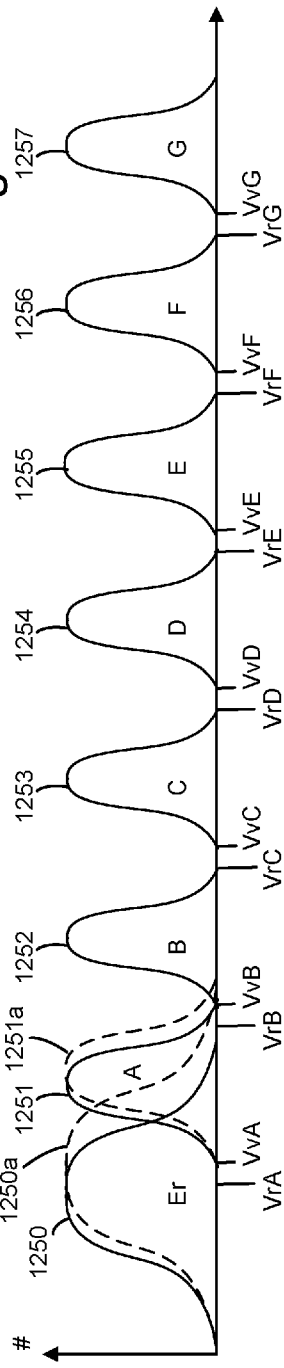

selected=WL0 or WL1
ramp rate/duration for WL0 and WL1=0.4xbaseline
ramp rate/duration for WL2-WL22=0.8xbaseline or baseline

Fig. 16A selected=WL0
ramp rate/duration for WL0=0.4xbaseline
ramp rate/duration for WL1=0.6xbaseline
ramp rate/duration for WL2-WL22=0.8xbaseline or baseline

Fig. 16B selected=WL1
ramp rate/duration for WL0=0.5xbaseline
ramp rate/duration for WL1=0.7xbaseline
ramp rate/duration for WL2-WL22=0.9xbaseline or baseline

Fig. 16C selected=WL2-WL22
ramp rate/duration for WL0-WL22=baseline

Fig. 16D

WORD LINE-DEPENDENT RAMPING OF PASS VOLTAGE AND PROGRAM VOLTAGE FOR THREE-DIMENSIONAL MEMORY

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 8 depicts example NAND strings in the sub-blocks SBa-SBd of FIG. 7.

FIG. 11 depicts a waveform of an example programming operation, consistent with FIG. 10.

FIG. 12A depicts example Vth distributions of memory cells of WL0 and WL4, after a block programming at room temperature.

FIG. 12B depicts example Vth distributions of memory cells of WL0 and WL4, after a block programming at high temperature.

FIG. 12C depicts example Vth distributions of memory cells of: 1) WL4 after programming all four sub-blocks, 2) WL0 after programming one block sub-block and 3) WL0 after programming all four sub-blocks.

FIG. 12D depicts example Vth distributions of memory cells of WL0, showing the effects of different ramp rates in the word line voltage.

FIG. 12E depicts example Vth distributions of memory cells of WL0, showing the effects of different magnitudes of the word line voltage.

FIG. 12F depicts example Vth distributions of memory cells of a drain-side word line, showing the effects of 1) not allowing sufficient time for the ramp up of the word line voltage compared to 2) allowing sufficient time.

FIG. 16A depicts an example scenario for ramp rate/duration.

FIG. 16B depicts another example scenario for ramp rate/duration.

FIG. 16C depicts another example scenario for ramp rate/duration.

FIG. 16D depicts another example scenario for ramp rate/duration.

DETAILED DESCRIPTION

Figure 1:
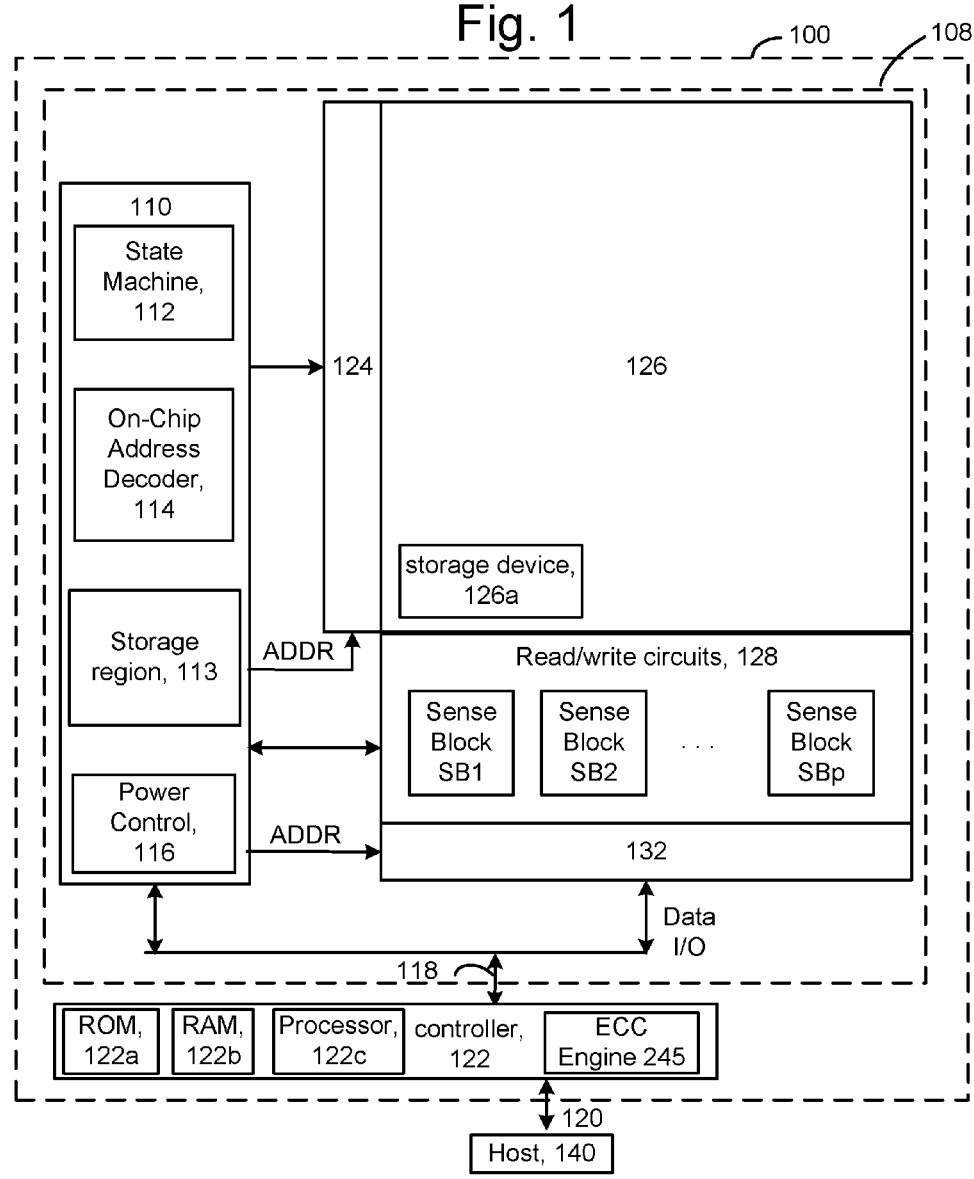
FIG. 1 is a block diagram of an example memory device.

Techniques are provided for programming a memory device in a way which reduces over-programming and program disturb. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 11. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 12B). In a three-bit per cell memory device, there are eight data states including the erased state and seven higher data states referred to as the A, B, C, D, E, F and G data states (see FIG. 12A). In a four-bit per cell memory device, there are sixteen data states including the erased state and fifteen higher data states referred to as the A, B, C, D, E, F, G, H, I, J, K, L, M, N and O data states.

However, memory cells can be inadvertently programmed when the program voltage is applied. For example, a memory cell connected to a selected word line in an unselected string, or to an unselected word line, can be inadvertently programmed. Inadvertent programming, or program disturb, can be caused by capacitive coupling from the selected word line to respective memory cells. For example, memory cells of the unselected NAND strings can be disturbed by voltages applied to word lines which are shared by the unselected NAND strings and the selected NAND strings. Memory cells which are to remain in the erased state based on the write data are most susceptible to program disturb. Program disturb causes increases their threshold voltage (Vth) and can result in a read error. To reduce program disturb, the channel of the unselected NAND string is boosted before the program voltage is applied. The boosting is primary provided by an increase in voltages (Vpass) of the unselected word lines, e.g., from 0 V to 8-10 V. This increase is coupled to the channel. Moreover, the select gate transistors at each end of the unselected NAND string are provided in a non-conductive state so that the channel voltages can float higher due to the capacitive coupling.

Further, over-programming can occur on memory cells connected to a selected word line, and in particular a source-side selected word line. This results in a Vth which is higher than desired at the end of a programming operation. Typically, a two-part program voltage is applied to the selected word line during each program loop in a multi-loop program operation. The voltage increases to a first level which is similar to a pass voltage applied on the unselected word lines, and then to a second, peak level. The peak level may step up during each program loop as the program operation continues, in a process referred to as incremental step pulse programming. During these voltages, a channel gradient which generates electron-hole pairs is caused in a portion of a channel material which is between the selected word line and an adjacent word line. This effect is particularly noticeable when the selected word line is a source-side word line, in which case the adjacent word line is a dummy word line. The electrons can travel as hot carriers into the charge-storing material of a memory cell and increase its Vth. The channel gradient is a change in the potential in the channel material, e.g., polysilicon, which runs the length of the string.

Techniques provided herein address the above and other issues. In one aspect, the ramp rate of the first part of a program voltage of a selected word line is reduced when the selected word line is at the source side of a string of memory cells, compared to when the selected word line is not at the source side of the string. In another aspect, the ramp rate of a voltage of unselected word lines is reduced when the selected word line is at the source side of a string of memory cells. The reduction for the unselected word lines may be less than the reduction for the selected word line. In another aspect, the ramp rate of the first part of a program voltage of a selected word line is also reduced when the selected word line is among a group of word lines at the source side of a string of memory cells.

In another aspect, a ramp rate is relatively lower when a selected string is in a sub-block which is programmed relatively later in a sub-block programming order.

In another aspect, a ramp duration is adjusted based on the position of a selected word line.

The ramp rate can also be adjusted as a function of ambient temperature in the memory device such that the ramp rate is relatively lower when the temperature is relatively higher.

Various other features and benefits are described below.

FIG. 1 is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for programming parameters as described further below, e.g., in connection with the process of FIG. 10.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowchart of FIG. 10. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
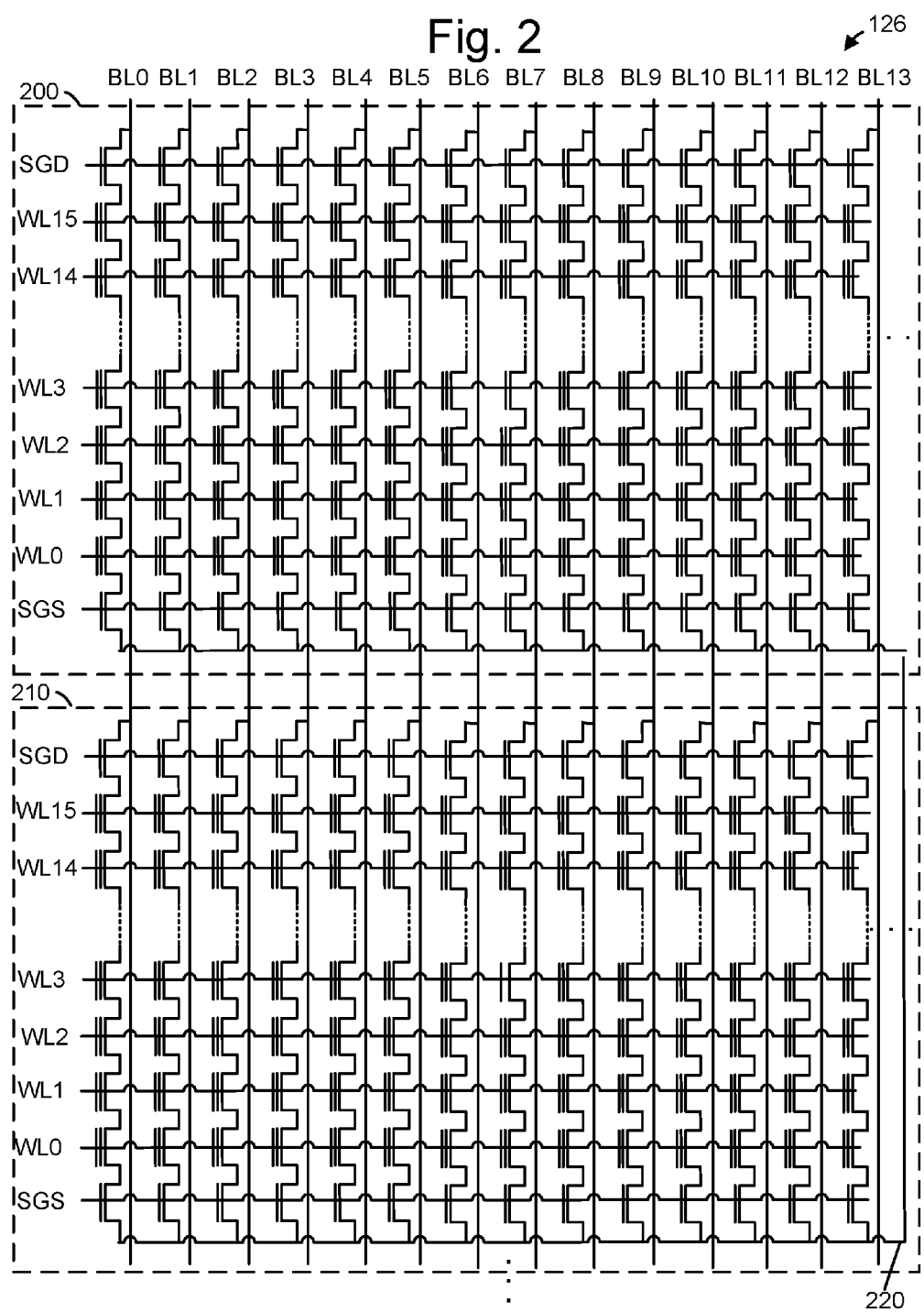
FIG. 2 depicts blocks of memory cells in an example two-dimensional configuration of the memory array 126 of FIG. 1.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. Other types of non-volatile memory can also be used. For example, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3:
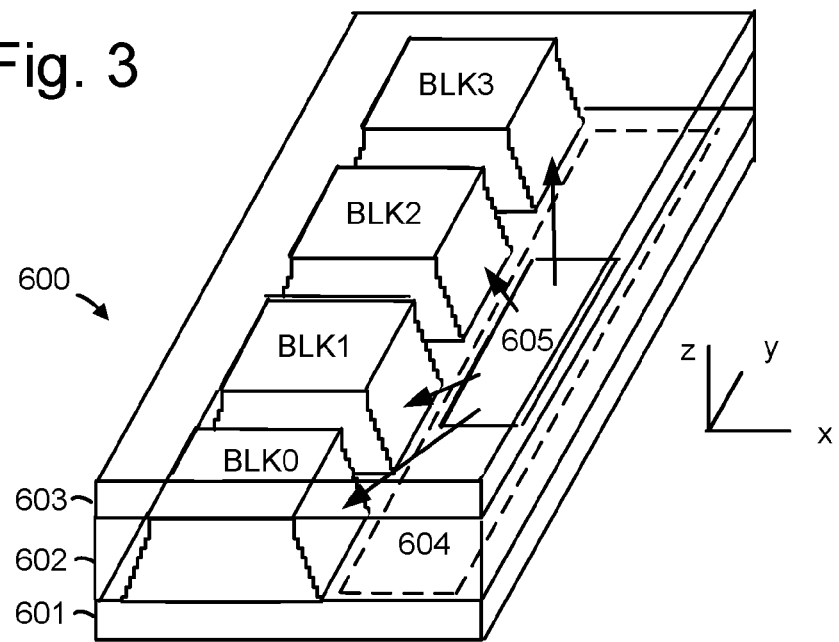
FIG. 3 is a perspective view of a memory device 600 comprising a set of blocks in an example three-dimensional configuration of the memory array 126 of FIG. 1.

FIG. 3 is a perspective view of a memory device 600 comprising a set of blocks in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
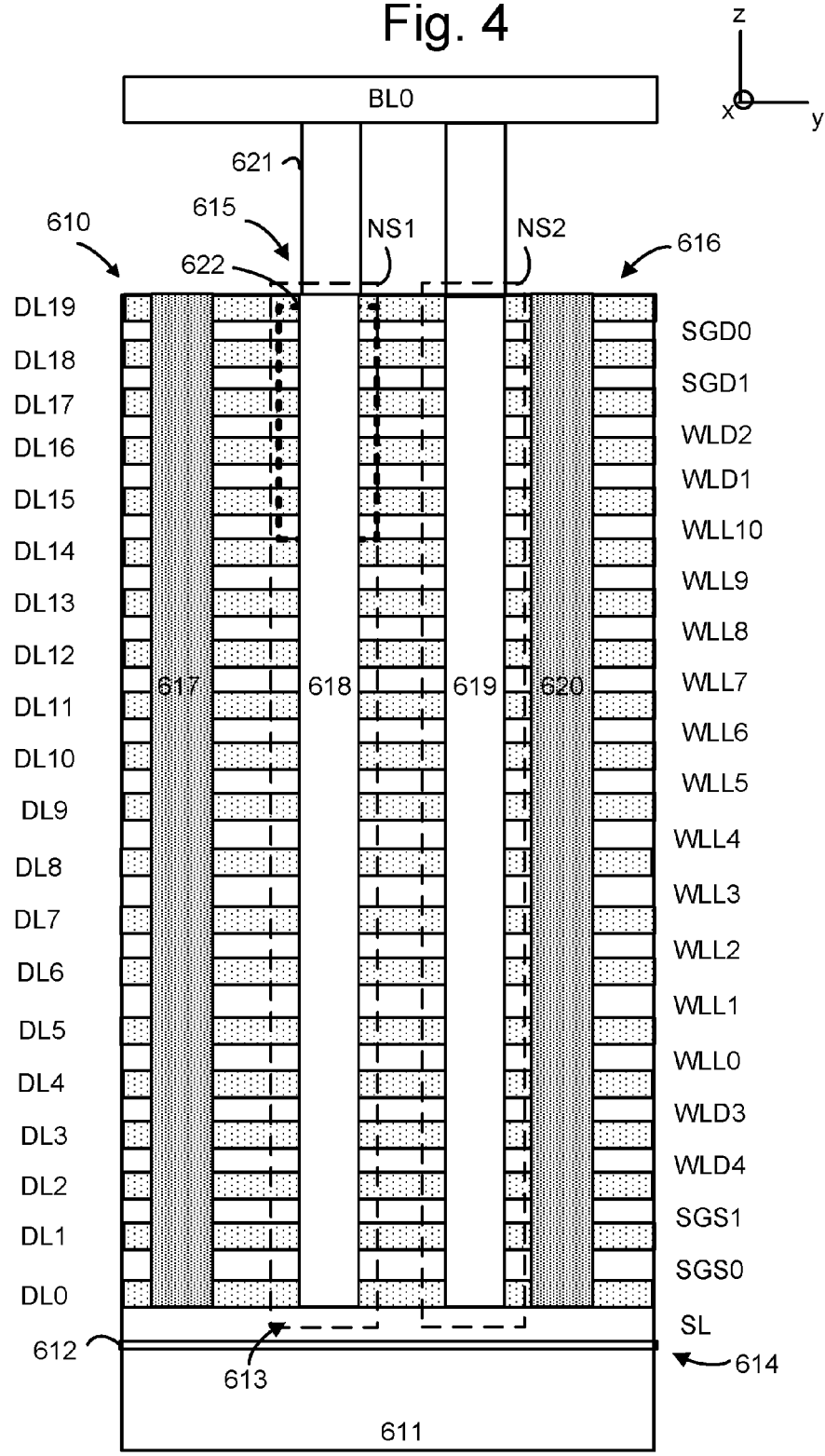
FIG. 4 depicts an example cross-sectional view of a portion of one of the blocks of FIG. 5.
Figure 5:
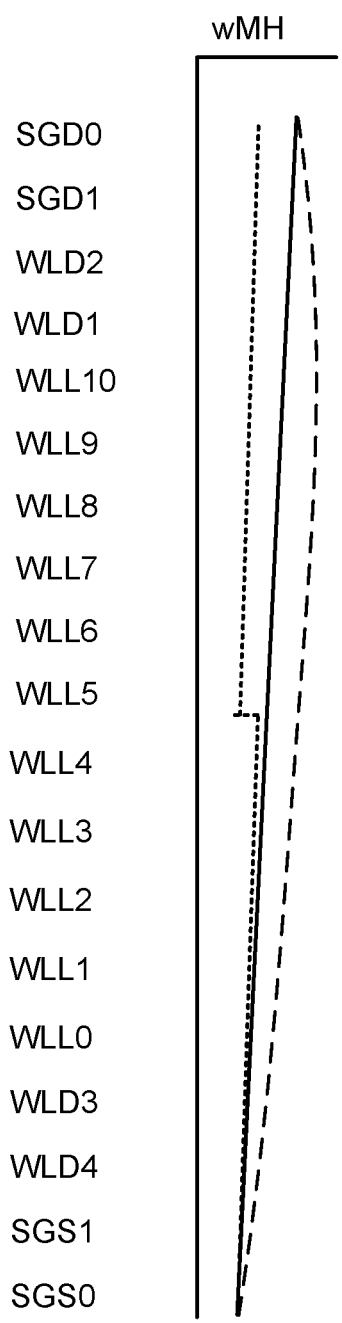
FIG. 5 depicts a plot of memory hole diameter in the stack of FIG. 4.

FIG. 4 depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers WLD1, WLD2, WLD3 and WLD4, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 5 depicts a plot of memory hole diameter in the stack of FIG. 4. The vertical axis is aligned with the stack of FIG. 4 and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

Figure 6:
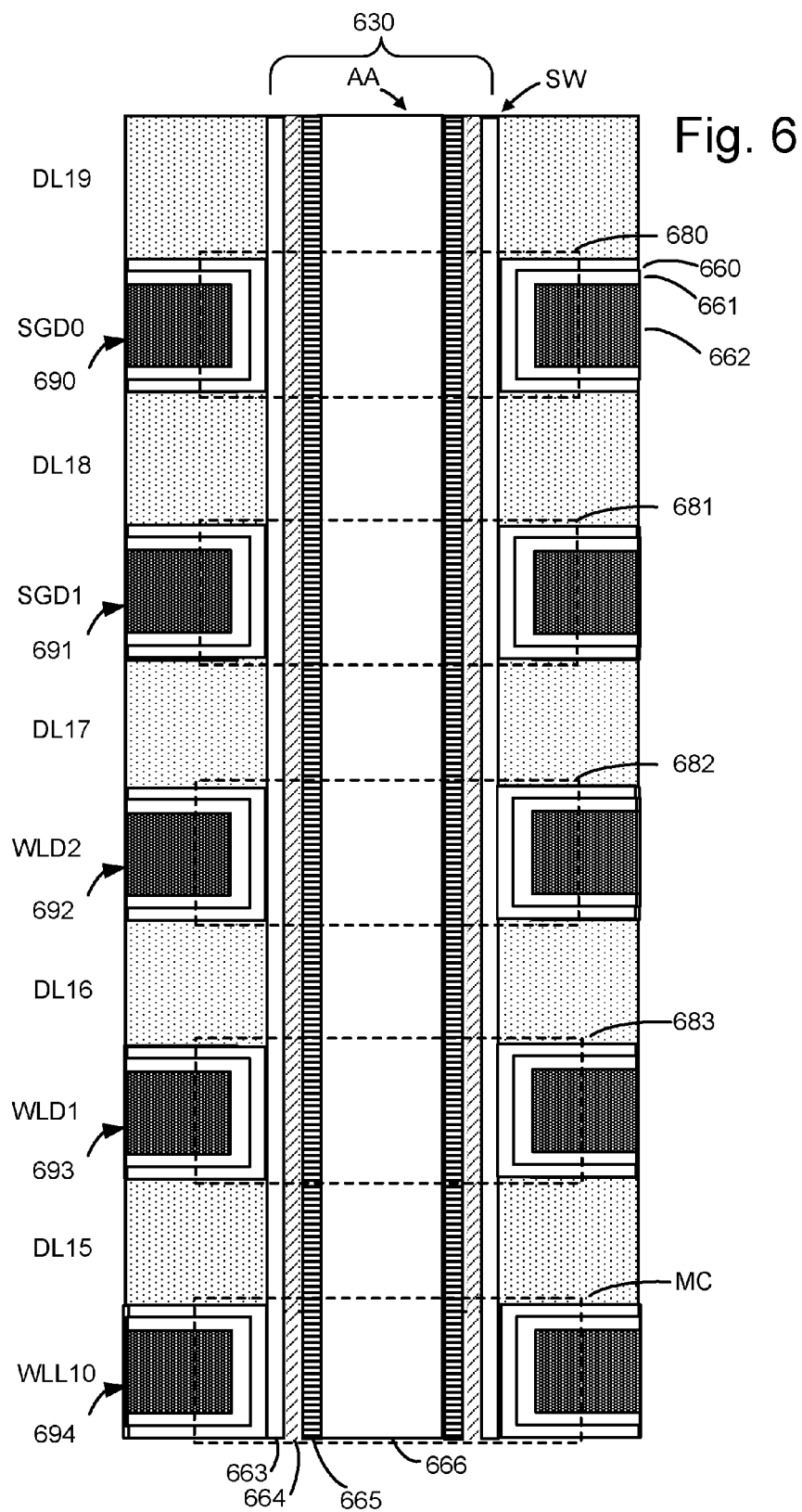
FIG. 6 depicts a close-up view of the region 622 of the stack of FIG. 4.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
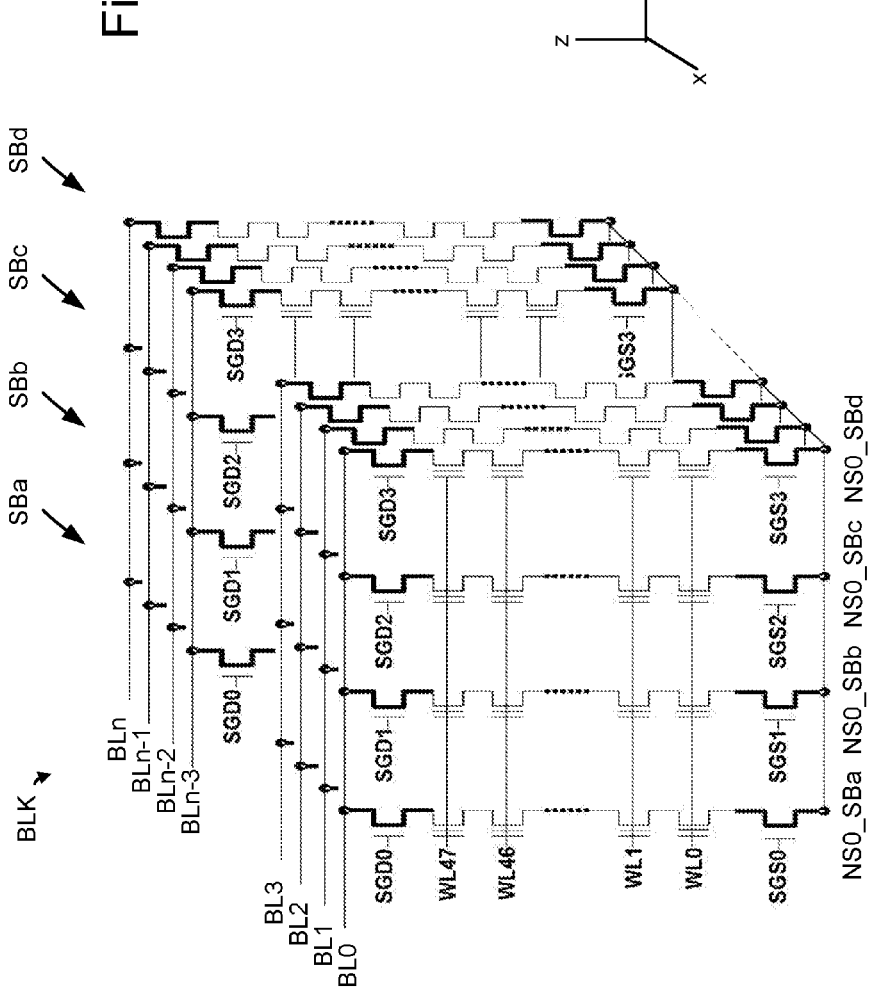
FIG. 7 depicts an example view of NAND strings in sub-blocks in a 3D configuration which is consistent with FIG. 5.

FIG. 7 depicts an example view of NAND strings in sub-blocks in a 3D configuration which is consistent with FIG. 5. The NAND strings includes NS0_SBa, NS0_SBb, NS0_SBc and NS0_SBd, which have 48 word lines, WL0-WL47, in this example. In a block BLK, each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Programming of the block may occur one sub-block at a time. For example, a sub-block programming order may be: 1) SBa, 2) SBb, 3) SBc and 4) SBd. Within each sub-block, a word line programming order may be followed, e.g., starting at WL0, the source-side word line and proceeding one word line at a time to WL47, the drain-side word line.

FIG. 8 depicts example NAND strings in the sub-blocks SBa-SBd of FIG. 7. The sub-blocks are consistent with the structure of FIG. 4. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

Memory cells on WL8 include memory cells 812, 832, 852 and 872. Memory cells on WL9 include memory cells 813, 833, 853 and 873. In this example, the programming of the block may occur sub-block by sub-block. For example, SBa may be programmed from WLL0-WLL10, then SBb may be programmed from WLL0-WLL10, then SBc may be programmed from WLL0-WLL10 and then SBd may be programmed from WLL0-WLL10.

Figure 9A:
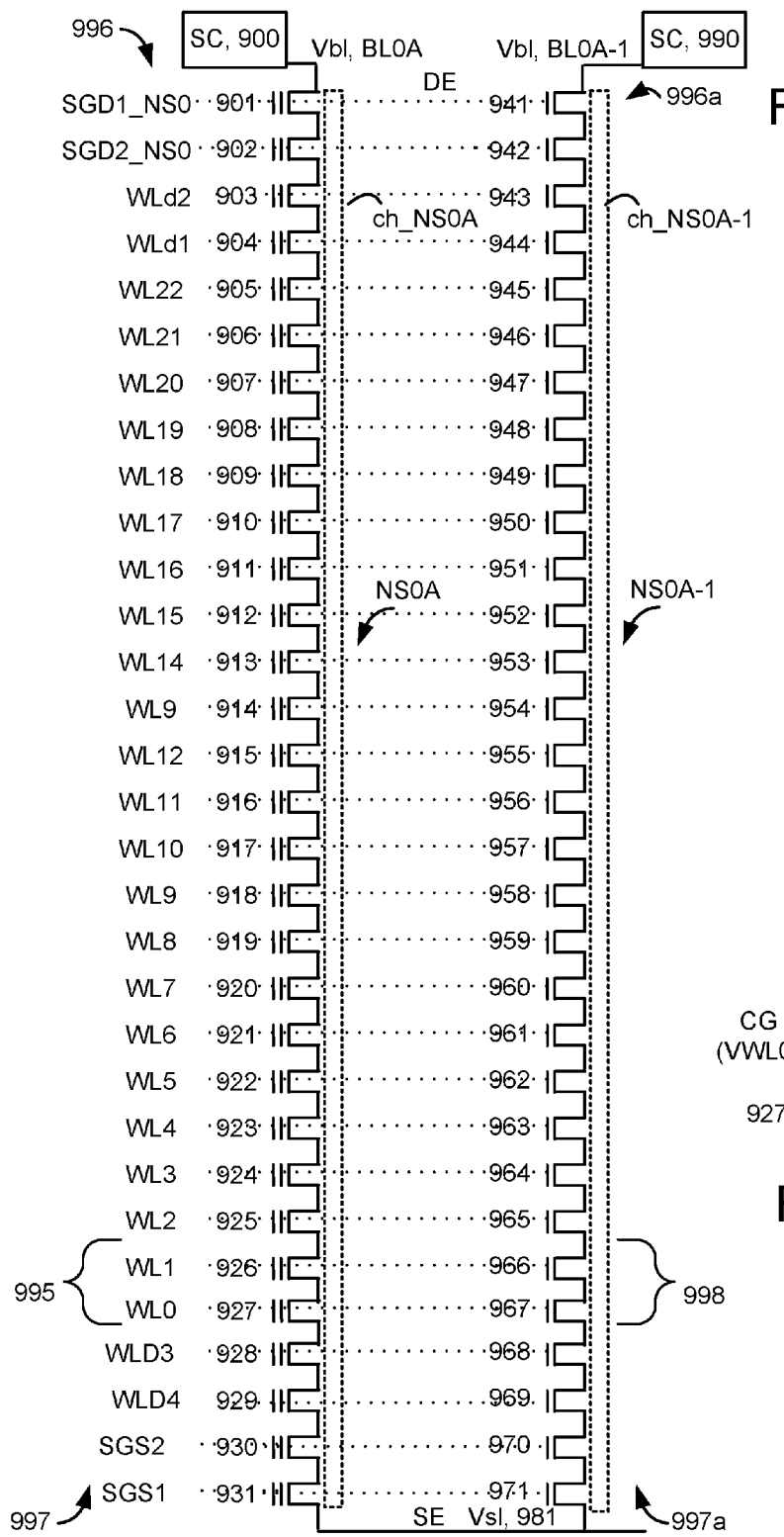
FIG. 9A depicts a circuit diagram of example NAND strings NS0A and NS0A-1.

FIG. 9A depicts a circuit diagram of example NAND strings NS0A and NS0A-1. The word lines for data memory cells are WL0-WL21. WL0-WL21 are connected to data memory cells 927-905, respectively, in NS0A and to data memory cells 967-945, respectively, in NS0A-1. Dummy word lines WLD1, WLD2, WLD3 and WLD4 are connected to dummy memory cells 904, 903, 928 and 929, respectively, in NS0A and to dummy memory cells 944, 943, 968 and 969, respectively, in NS0A-1. The word lines are connected to both the selected and unselected NAND strings. An SGD line, SGD1_NS0 is connected to the SGD transistors 901 and 941 while an SGD line, SGD2_NS0 is connected to the SGD transistors 902 and 942.

An SGS line, SGS1 is connected to the SGS transistors 931 and 971, and an SGS line, SGS2 is connected to the SGS transistors 930 and 970.

A channel of NS0A is ch_NS0A and a channel of NS0A-1 is ch_NS0A-1. A current in the channel of NS0A is sensed by sensing circuitry (SC) 900 via a bit line BL0A which is at a voltage, Vbl. A current in the channel of NS0A-1 is sensed by sensing circuitry (SC) 990 via a bit line BL0A-1 which is at a voltage, Vbl.

A source line 981 is connected to source ends of the NAND strings. Voltage drivers can be used to provide voltages on the control lines (e.g., word lines, select gate lines, bit line and source line).

As an example, NS0A may be a selected NAND string and NS0A-1 may be an unselected NAND string.

This figures shows a set of word lines (WL0-WL22); a selected string (NS0A) comprising a set of data memory cells 905-927 extending between a group 995 of one or more (e.g., two in this example) source-side data memory cells 926 and 927 at a source-side 997 of the selected string and a drain-side data memory cell 905 at a drain-side 996 of the selected string; an unselected string (NS0A-1) of data memory cells 945-967 extending between a group 998 of one or more source-side data memory cells 966 and 967 at a source-side 997a of the unselected string and a drain-side data memory cell 945 at a drain-side 996a of the unselected string, wherein each word line in the set of word lines is connected to a respective data memory cell in the selected string and to a respective data memory cell in the unselected string.

Figure 9B:
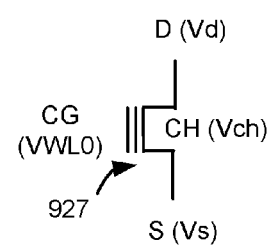
FIG. 9B depicts the example memory cell 927 of FIG. 9A.

FIG. 9B depicts the example memory cell 927 of FIG. 9A. The memory cell comprises a control gate CG which receives a word line voltage Vwll0, a drain at a voltage Vd, a source at a voltage Vs and a channel at a voltage Vch.

Figure 10:
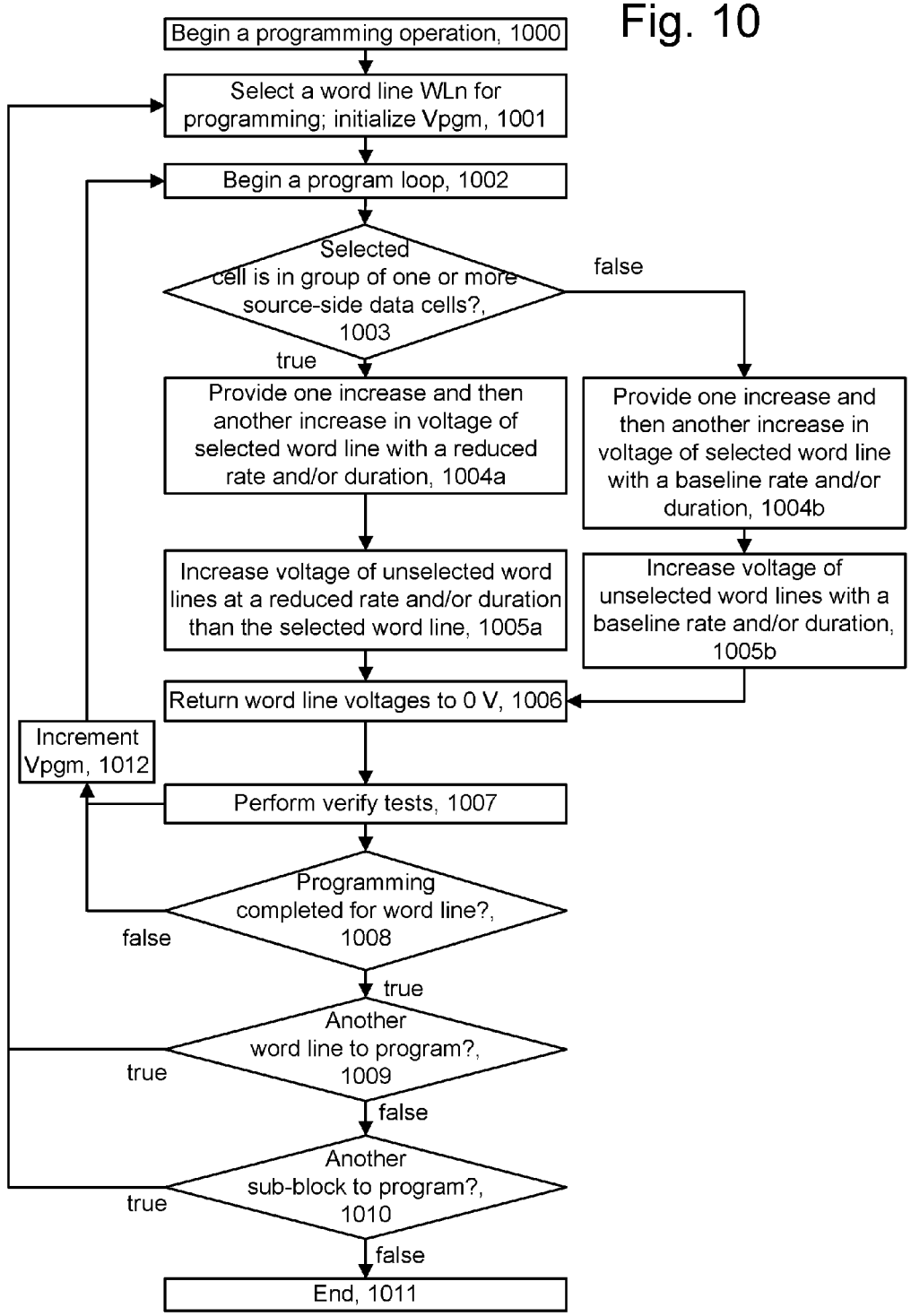
FIG. 10 depicts an example programming operation in which a ramp rate and/or duration of word line voltages are based on a position of the selected word line.

FIG. 10 depicts an example programming operation in which a ramp rate and/or duration of word line voltages are based on a position of the selected word line. Step 1000 begins a programming operation. Step 1001 selects a word line (WLn) for programming and initializes Vpgm. Step 1002 begins a program loop or program-verify iteration. A decision step 1003 determines whether, in a selected string, the selected memory cell is in a group of one or more source-side data memory cells at a source side of a string. For example, the group can comprise a single cell which is the source-side cell, e.g., cell 927 in NS0A or cell 967 in NS0A-1 of FIG. 9A. In another example, the group can comprise two cells including the source-side cell and the cell adjacent to it, on the drain side of the source-side cell. The adjacent cell may be cell 926 in NS0A or cell 966 in NS0A-1 of FIG. 9A.

In other words, decision step 1003 determines whether the selected word line is in a group of one or more source-side data word lines at a source side of a string. The group of one or more source-side data memory cells in a selected string may comprise no more than 10% of the data memory cells in the selected string, for example. This group comprises cells which are most likely to be affect by over-programming. In one example, the group of one or more source-side data memory cells comprises no more than two or three cells. The source-side data memory cells in a selected string are adjacent to one another. Or, the group of one or more source-side data word lines may comprise no more than 10% of the word lines in a set of data word lines of a block or sub-block.

If decision step 1003 is true, step 1004a is reached. This step provides one increase and then another increase in the voltage of the selected word line with a reduced rate and/or duration, e.g., compared to the baseline rate and/or duration used in step 1004b, where the selected memory cell is not in a group of one or more source-side data memory cells at a source side of a string. Step 1005a provides an increase in the voltages of unselected word lines at a reduced rate and/or duration. This rate and/or duration may be greater than the rate and/or duration of the selected word line of step 1004a.

If decision step 1003 is false, step 1004b is reached. This step provides one increase and then another increase in the voltage of the selected word line with a baseline rate and/or duration. Step 1005b provides an increase in the voltages of unselected word lines with a same baseline rate and/or duration as the rate and/or duration of the selected word line of step 1004b. See FIGS. 15A and 15B for example voltage waveforms.

Step 1006 returns the word line voltages to about 0 V or other baseline level.

Step 1007 involved performing verify tests. In one approach, as described in FIG. 11, verify tests are performed for a subset of all target data states, for the memory cells which have not yet completed programming.

Decision step 1008 determines if programming is completed for the selected word line. Decision step 1008 is true if all, or nearly all of the memory cells which are to be programmed have passed their respective verify test. A memory cell passes a verify test when a verify voltage is applied to its control gate via a word line and the memory cell is determined by sensing circuitry to be in a non-conductive state. In this case, the Vth of the memory cell exceeds the verify voltage. If decision step 1008 is false, Vpgm is incremented at step 1012, and a next program loop is performed at step 1002. If decision step 1008 is true, decision step 1009 determines whether there is another word line to program, e.g., in the currently selected sub-block. If decision step 1009 is false, decision step 1010 determines whether there is another sub-block to program, e.g., in the currently selected block. If decision step 1009 is true, a next word line in the current sub-block is selected to be programmed at step 1001. If decision step 1010 is true, a first word line in the next sub-block is selected to be programmed at step 1001. If decision step 1010 is false, the programming operation ends at step 1011.

In this example, programming for a selected word line is completed before starting programming of another word line.

FIG. 11 depicts a waveform of an example programming operation, consistent with FIG. 10. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105, . . . 1106 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1110) may be applied after each of the program voltages 1101 and 1102. A-, B- and C-state verify voltages of VvA, VvB and VvC (waveform 1111) may be applied after each of the program voltages 1103 and 1104. After several additional program loops, not shown, E-, F- and G-state verify voltages of VvE, VvF and VvG (waveform 1112) may be applied after the final program voltage 1106.

FIG. 12A depicts example Vth distributions of memory cells of WL0 and WL4, after a block programming at room temperature, e.g., 60 degrees F. In this example, there are eight possible data states, e.g., the erased (Er) and seven programmed states which are the A, B, C, D, E, F and G states. The Er, A, B, C, D, E, F and G states for WL4 are represented by the Vth distributions 1200, 1201, 1202, 1203, 1204, 1205, 1206 and 1207, respectively. The Er, A, B, C, D, E, F and G states for WL0 are represented by the Vth distributions 1200a, 1201a, 1202a, 1203a, 1204a, 1205a, 1206a and 1207a, respectively. WL0 is the source-side data word line which is most susceptible to over-programming due to hot carrier injection. Moreover, the Er state is the state which is most susceptible to program disturb. Accordingly, the upper tail of the Vth distribution 1200a of the Er state extends into the A-state distribution, for instance, well above the read level of VrA. The other read voltages are VrB, VrC, VrD, VrE, VrF and VrG. The Er-state cells with Vth>VrA will therefore be read inaccurately as being in the A state.

The block programming indicates that an entire block was programmed, including the cells of WL0 and WL4 as well as cells of other word lines, in each sub-block of a block. As discussed further below, e.g., in connection with FIG. 12C, the extent of programming of WL0 can affect the amount of over-programming.

For the programmed states, there is some over-programming for WL0 compared to WL4, as indicated by the higher upper tails of the Vth distributions 1201a, 1202a, 1203a, 1204a, 1205a, 1206a and 1207a relative to the Vth distributions 1201, 1202, 1203, 1204, 1205, 1206 and 1207, respectively. However, this upshift is relatively smaller than the upshift in FIG. 12B. The amount of upshift for the highest data state, shown by the Vth distribution 1207a is slightly higher in some cases than for other programmed data states.

WL4 is mentioned as an example of a typical word line which is not at the source or drain side of a string.

FIG. 12B depicts example Vth distributions of memory cells of WL0 and WL4, after a block programming at high temperature, e.g., 90 degrees F. The Er, A, B, C, D, E, F and G states for WL4 are represented by the Vth distributions 1210, 1211, 1212, 1213, 1214, 1215, 1216 and 1217, respectively. The Er, A, B, C, D, E, F and G states for WL0 are represented by the Vth distributions 1210a, 1211a, 1212a, 1213a, 1214a, 1215a, 1216a and 1217a, respectively. The upper tail of the Vth distribution 1210a of the Er state extends further into the A-state distribution compared to FIG. 12A. Similarly, the amount of over-programming for the programmed states on WL0 compared to WL4 is higher than in FIG. 12A due to the higher temperature. This reinforces the theory that hot carrier injection causes over-programming, since hot carrier injection increases with temperature.

FIG. 12C depicts example Vth distributions of memory cells of: 1) WL4 after programming of the word line in all four sub-blocks, 2) WL0 after programming of the word line in one sub-block and 3) WL0 after programming of the word line in all four sub-blocks. In these examples, only WL0 or WL4 was programmed in the sub-block to focus on the effects of programming one word line.

The Er, A, B, C, D, E, F and G states for case 1) are represented by the Vth distributions 1220, 1221, 1222, 1223, 1224, 1225, 1226 and 1227, respectively. In this case, the memory cells in WL4 in an entire block comprising sub-blocks SBa, SBb, SBc and SBd of FIG. 7 or 8 were programmed, one sub-block at a time. The Er, A, B, C, D, E, F and G states for case 2) are represented by the Vth distributions 1220a, 1221a, 1222a, 1223a, 1224a, 1225a, 1226a and 1227a, respectively. In this case, the memory cells of WL0 in one sub-block were programmed, e.g., SBa of FIG. 7 or 8. The Er, A, B, C, D, E, F and G states for case 3) are represented by the Vth distributions 1220b, 1221b, 1222b, 1223b, 1224b, 1225b, 1226b and 1227b, respectively. In this case, the memory cells of WL0 in all four sub-blocks were programmed. High temperature is used to show a worst-case scenario.

Over-programming is worse on WL0 after programming of all sub-blocks, compared to programming one sub-block. Since the word line extends in all sub-blocks, programming in one sub-block can cause over-programming in all sub-blocks. Further, the amount of over-programming increases as the amount of programming increases, e.g., the number of program operations performed on a word line increases. Each program voltage provides an opportunity of over-programming.

FIG. 12D depicts example Vth distributions of memory cells of WL0, showing the effects of different ramp rates in the word line voltage. The amount of over-programming on WL0 is affected by a ramp rate, e.g., rate of increase, of the voltages on the selected and unselected word lines. Moreover, the ramp rate of the voltages on the selected word line has a larger impact than the ramp rate of the voltages on the unselected word lines, because the worst case channel gradient is adjacent to the selected word line. In particular, a lower ramp rate can suppress over-programming because hot carrier generation is more severe if the channel boosting potential is increased too quickly. If the ramp rate is lower, the hot carriers have a better chance to be consumed by the channel boosting potential, reducing the amount of hot carriers which are available to cause over-programming.

For the case of a two-step voltage of the selected word line, the lower ramp rate can be provided on the first and/or second steps. Lowering the rate of increase of the voltage on the second step may increase programming time more than lowering the rate of increase of the voltage on the first step, because the second step is typically larger than the first step. Either or both options are effective in reducing over-programming.

In another aspect, since a lower ramp rate can suppress over-programming, the peak level of the voltage (e.g., the peak voltage of the unselected word lines and/or the first step voltage of the selected word line) may be increased to reduce program disturb. Increasing this voltage improves channel boosting for unselected strings so that program disturb is reduced. The peak voltage of the unselected word lines and the first step voltage of the selected word line will both be referred to as a pass voltage for simplicity in some cases herein, as they are often equal or similar in magnitude.

In FIG. 12D, a comparison is made of a 1) baseline ramp rate (dashed lines) and a 2) ramp rate which is four times lower compared to the baseline ramp rate (solid lines). The amount of over-programming is reduced with the lower ramp rate for all data states. The improvement is more significant for the lower states. The magnitude of the pass voltage is the same in both cases. The Er, A, B, C, D, E, F and G states for case 1) are represented by the Vth distributions 1230a, 1231a, 1232a, 1233a, 1234a, 1235a, 1236a and 1237a, respectively. The Er, A, B, C, D, E, F and G states for case 2) are represented by the Vth distributions 1230, 1231, 1232, 1233, 1234, 1235, 1236 and 1237, respectively.

FIG. 12E depicts example Vth distributions of memory cells of WL0, showing the effects of different magnitudes of the word line voltage. As mentioned, a higher pass voltage can be used when the ramp rate is reduced. A comparison is made of a 1) baseline ramp rate (dashed lines) with a lower pass voltage and a 2) ramp rate which is four times lower than the baseline ramp rate (solid lines), with a higher pass voltage, e.g., 1 V higher. The primary result is that the amount of over-programming is substantially reduced for the erased state when the ramp rate is lower.

The Er, A, B, C, D, E, F and G states for case 1) are represented by the Vth distributions 1240a, 1241a, 1242a, 1243a, 1244a, 1245a, 1246a and 1247a, respectively. The Er, A, B, C, D, E, F and G states for case 2) are represented by the Vth distributions 1240, 1241, 1242, 1243, 1244, 1245, 1246 and 1247, respectively.

FIG. 12F depicts example Vth distributions of memory cells of a drain-side word line, showing the effects of 1) not allowing sufficient time for the ramp up of the word line voltage compared to 2) allowing sufficient time. The examples of FIG. 12A to 12E focused on WL0, the source-side word line. The drain-side data word line, e.g., WL10 in FIG. 8 or WL22 in FIG. 9A, also has special concerns as an edge word line. Generally, for any word line, program disturb is greater when the ramp rate of the pass voltage is reduced so much that the pass voltage is not allowed to ramp up to the baseline level, such as depicted by plot 1503 in FIG. 15A (case 1). The increased program disturb is due to a reduced channel boosting potential under the word line. This problem is larger for the drain-side edge word line compared to non-edge word lines because the voltage on the dummy word line on the drain side of the drain-side edge word line is typically lower than the voltage on the data word line on the source side of the drain-side edge word line. Thus, the channel boosting contribution of the dummy word line is lower. By extending the allowed time period for the ramp up to occur, the pass voltage can reach its intended level and program disturb can be reduced (case 2). In both cases, a ramp which is four times lower than the baseline ramp rate is used.

The Er and A states for case 1) are represented by the Vth distributions 1250a and 1251a, respectively. The Er and A states for case 2) are represented by the Vth distributions 1250 and 1251, respectively. The B, C, D, E, F and G states for case 1) and 2) are substantially the same and are represented by the Vth distributions 1252, 1253, 1254, 1255, 1256 and 1257, respectively.

Figure 13A:
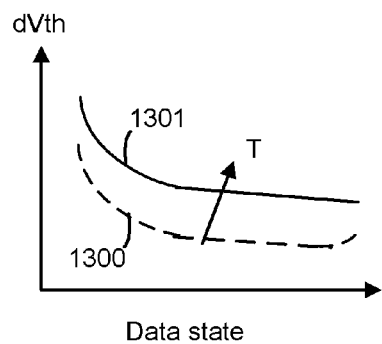
FIG. 13A depicts a plot of an increase in Vth for WL0 relative to WL4 as a function of temperature and data state, consistent with FIG. 12A.

FIG. 13A depicts a plot of an increase in Vth for WL0 relative to WL4 as a function of temperature and data state, consistent with FIG. 12A. A plot 1300 represents room temperature and a plot 1301 represents a high temperature. Due to increase generation of hot carriers, over-programming increases at higher ambient temperatures in the memory device. Moreover, the lower data states are most affected.

Figure 13B:
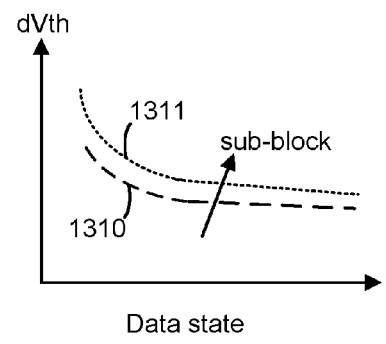
FIG. 13B depicts a plot of an increase in Vth for WL0 as a function of sub-block.

FIG. 13B depicts a plot of an increase in Vth for WL0 as a function of sub-block. A plot 1310 represents an earlier programmed sub-block and a plot 1311 represents a later programmed sub-block. As mentioned, due to a sub-block programming order, and the fact that a word line extends across sub-blocks, the memory cells along a word line will be subject to hot carriers as each sub-block is programmed. The amount of over-programming can therefore increase as each sub-block is programmed. One approach to address this is to provide a gradually lower ramp rate as each successive sub-block is programmed, e.g., rate1 for SBa, rate2 for SBb, rate3 for SBc and rate4 for SBd, where rate1>rate2>rate3>rate4. Or, one ramp rate can be provided as one or more sub-blocks (e.g., rate1 for SBa, SBb) are programmed relatively sooner in the sub-block programming order and another, lower ramp rate can be provided as one or more sub-blocks (e.g., rate2 for SBb, SBc, where rate1>rate2) are programmed relatively later in the sub-block programming order. See also FIG. 15D.

Figure 14:
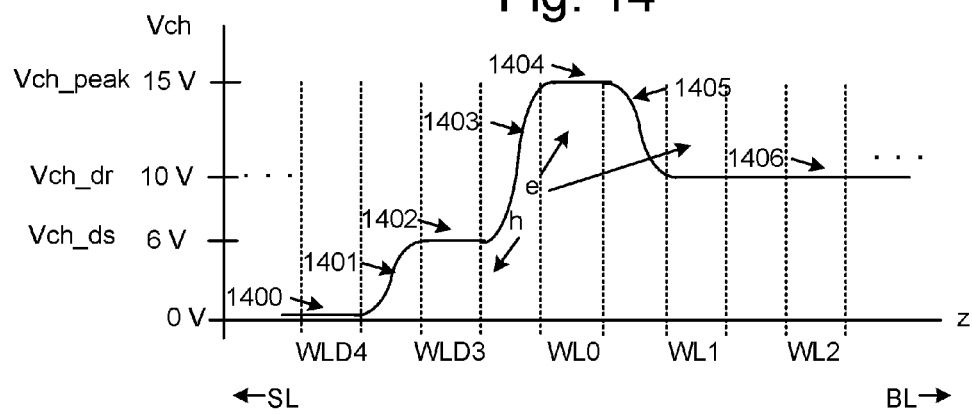
FIG. 14 depicts a plot of a channel voltage in an unselected NAND string, where a channel gradient between the selected word line (WL0) and a dummy word line (WLD3) results in electron-hole generation.

FIG. 14 depicts a plot of a channel voltage (Vch) in an unselected NAND string, where a channel gradient between the selected word line (WL0) and a dummy word line (WLD3), consistent with FIG. 9A, results in electron-hole generation. The vertical axis depicts Vch and the horizontal axis depicts locations along a channel of a string of cells such as a NAND string. The locations are sectioned off by vertical dashed lines, where the region between adjacent dashed lines corresponds to a channel region directly adjacent to a transistor/word line or to a channel region between transistors/word lines. A focus is on the source side of the string. The source line (SL) is to the left and the bit line (BL) is to the right. WL0 is the source-side data word line, WLD3 is a first dummy word line, adjacent to WL0 and WLD4 is a second dummy word line, adjacent to WLD3. WL1 is a data word line adjacent to WL0 and WL2 is a data word line adjacent to WL1.

The majority of the channel boosting in an unselected NAND string is due to capacitive coupling from the word lines to the channel while the channel voltage is floating. To float the channel voltage, the select gate transistors are turned off (made non-conductive). For example, 0 V may be applied to the control gates of the SGD and SGS transistors. 0 V may also to WLD4. WLD3 receives a voltage Vch_ds such as 6 V. WL0 receives a voltage such as 9 V in a first step and 15-25 V in a second step. WL1, WL2 and the other word lines receive a pass voltage such as 10 V. A rough estimate of the channel voltage is the word line voltage (Vcg) minus the Vth of the transistor. The dummy cells may have Vth=0 V, for instance. These cells are not programmed and have a fixed Vth. Moreover, when WL0 is initially programmed, the cells on WL0 and the other word lines are in the erased state and may also have Vth=0 V, for instance. As a result, for the channel region directly adjacent to WLD4, Vch=Vcg−Vth=0−0=0 V (plot portion 1400). For the channel region directly adjacent to WLD3, Vch_ds=Vcg−Vth=6−0=6 V (plot portion 1402). For the channel region directly adjacent to WL0, Vch_peak=Vcg−Vth=15−0=0 V (plot portion 1404). For the channel regions directly adjacent to WL1 and WL2, Vch_dr=Vcg−Vth=10−0=10 V (plot portion 1406).

A channel gradient which is proportional to 6 V (plot portion 1401) is formed between WLD4 and WLD3. A channel gradient which is proportional to 15−6=9 V (plot portion 1403) is formed between WLD3 and WL0. A channel gradient which is proportional to 15−10=5 V (plot portion 1405) is formed between WL0 and WL1. The channel gradient represented by plot portion 1403 is the largest of the three gradients. Pairs of electrons (e) and holes (h) are generated. The electrons can enter the charge trapping region of the cells connected to WL0 causing over-programming. The electrons can travel even further, entering the charge trapping region of the cells connected to WL1, for instance, also causing over-programming but to a lesser extent than for the cells of WL0. Moreover, as the program voltage (Vpgm) steps up, the gradient (plot portion 1403) will increase further, increasing the likelihood of over-programming.

Figure 15A:
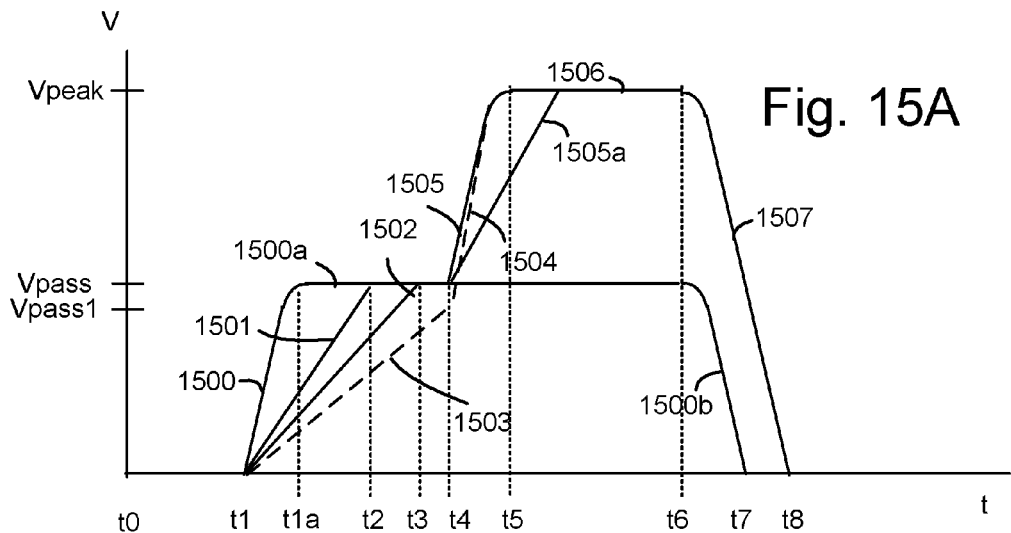
FIG. 15A depicts example word line voltages, consistent with FIG. 10.

FIG. 15A depicts example word line voltages, consistent with FIG. 10. The vertical axis depicts voltage and the horizontal axis depicts time. The plots may represent one of the program voltages 1101, 1102, 1103, 1104, 1105, . . . 1106 of FIG. 11, for instance, as well as voltages of unselected word lines. The selected word line voltage may increase in two steps to avoid generating a very large and sudden channel gradient. A first step is from 0 V to an intermediate level, Vpass, and the second step is from Vpass to Vpeak, which is the maximum or peak voltage for the selected word line in the program loop. Vpeak may step up in each program loop, in one approach. The voltage then steps down from Vpeak to 0 V in plot 1507.

The plots 1500, 1501, 1502 and 1503 represent progressively lower ramp rates or, generally, rates of increase. The rate of increase or ramp rate for plots 1501, 1502 and 1503 is Vpass/(t2−t1), Vpass/(t3−t1) and Vpass1/(t4−t1), respectively.

The plot 1500 represents a step increase in voltage as a baseline case. The control requests the voltage to transition directly from 0 V to Vpass. However, there is a finite time needed for the voltage to achieve the requested level so there is a small slope to the plot 1500. The plot 1500 represents a baseline ramp rate (e.g., Vpass/(t1a−t1)) and/or duration (e.g., t1a−t1) for the voltage of an unselected word line or for the first step up of the voltage of a selected word line.

The plots 1501-1503 depict cases where the requested voltage is not increased in one step, but is increased gradually in a ramp. A plot 1500a represents a constant voltage which is reached by the plots 1500, 1501 and 1502 but not by the plot 1503. A plot 1500b represents the voltage decreasing to 0 V. The plot 1503 only reaches Vpass1 at t4 when the word line voltage is stepped up in the second step. The plot 1505 represents the second step after plots 1500, 1501 and 1502 and the plot 1504 represents the second step after plot 1503. The plot 1505 represents a baseline ramp rate (e.g., (Vpeak−Vpass)/(t5−t4)) and/or duration (t5−t4) for the second step up of the voltage of a selected word line.

The first step thus begins at t1 and the second step begins at t4. T4−t1 is a time allowed for the voltage to increase in the first step. t5−t4 is the time for the voltage to increase in the second step. The plot 1505a shows the option to reduce the rate of increase during the second step in addition to, or instead of, reducing the rate of increase during the first step. A plot 1506 represents a constant voltage which is reached.

As mentioned, when the selected word line is in a group of one or more source-side word lines (e.g., WL0 and WL1) at a source-side of a string, the ramp rate may be reduced below the baseline such as by using plots 1501, 1502 or 1503. When the selected word line is not in such as group, the baseline increase may be used (plot 1500).

The rate of increase of the voltage of the unselected word lines may be reduced when the selected word line is in the group of one or more source-side word lines. The rate of increase of the voltage of the unselected word lines may be larger than the rate for the selected word line when the selected word line is in the group of one or more source-side word lines. The rate of increase of the voltage of the unselected word lines may be equal to the rate for the selected word line when the selected word line is not in the group of one or more source-side word lines.

Figure 15B:
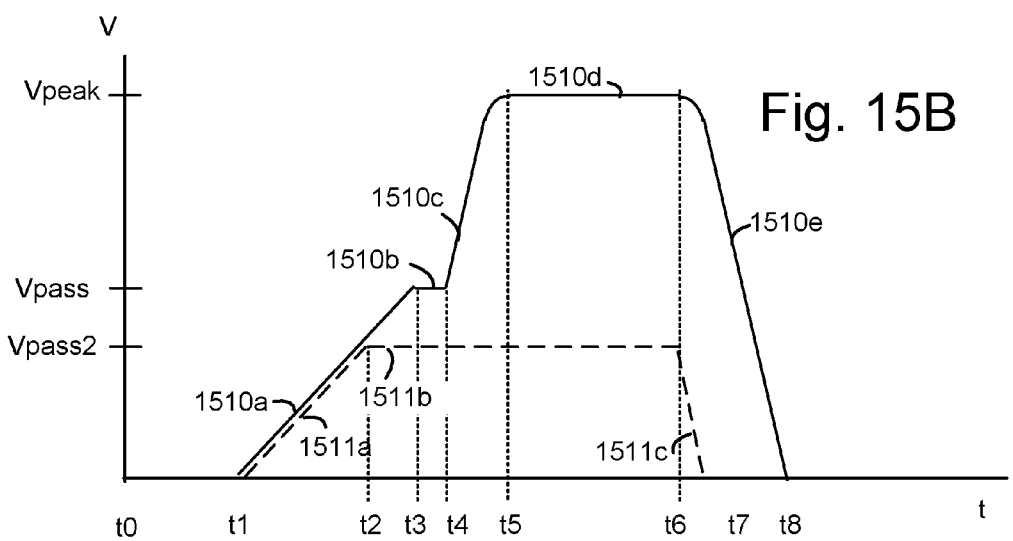
FIG. 15B depicts additional example word line voltages, consistent with FIG. 10, showing two examples of ramp durations with a constant ramp rate.

FIG. 15B depicts additional example word line voltages, consistent with FIG. 10, showing two examples of ramp durations with a constant ramp rate. The vertical axis depicts the word line voltage, and the horizontal axis depicts time. This approach has the advantage that the circuitry for implementing the ramp can be simplified.

For a selected word line, a plot 1510a represents a voltage increasing at a constant rate (e.g., Vpass/(t3–t1)) for a duration of t3–t1. A plot 1510b represents the voltage being at a fixed level of Vpass from t3–t4. A plot 1510c represents the voltage increasing to Vpeak in the second step of the program voltage. The rate is (Vpeak–Vpass)//(t5–t4) for a duration (t5–t4) of t3–t1. A plot 1510d represents the voltage being at a fixed level of Vpeak from t5–t6. A plot 1510e represents the voltage decreasing to 0 V.

For an unselected word line, a plot 1511a represents a voltage increasing at the constant rate for a duration of t2–t1 at a rate of Vpass2/(t2–t1)=Vpass/(t3–t1). A plot 1511b represents the voltage being at a fixed level of Vpass2<Vpass from t2–t6. A plot 1511c represents the voltage decreasing to 0 V.

In this case, a maximum level reached by the voltage of the selected word line due to one increase (the first step increase) is lower when the selected data memory cell is among the group of one or more source-side data memory cells in the selected string than when the selected data memory cell is not among the group of one or more source-side data memory cells in the selected string. The maximum level reached is Vpass2 instead of Vpass.

Techniques are proposed to achieve the best results in terms of minimizing over-programming and program disturb of the source-side word line and minimizing program disturb of the drain-side word line. One approach is a word line-dependent ramp rate for the pass voltage. A lower ramp rate can be used for the source-side word line to suppress over-programming and a higher ramp rate can be used for the drain-side word lines to reduce program disturb. Another approach is a word line-dependent ramp time/duration for the pass voltage. It is desirable to use a lower ramp rate to avoid over-programming. However, this can increase programming time. One possible solution is to use a fixed ramp rate regardless of the position of the selected word line. In this solution, a longer ramp duration can be used for the drain-side word lines to allow the pass voltage to reach its baseline level (Vpass in FIG. 15B). The relatively high pass voltage helps reduce program disturb. A shorter ramp duration can be used for the source-side word lines so that the pass voltage reaches a lower level, e.g., Vpass2, below the baseline level. For the source-side word lines, the memory cells on the drain side are in an erased state because they have not yet been programmed, based on the word line programming order. As a result, a lower pass voltage is sufficient to combat program disturb. This is true because the channel boosting level is a function of Vcg-Vth of the cells. With Vth being lower, Vcg can be lower to provide the same channel boosting.

The same concepts can be applied to the ramp rate for the selected word line. A word line-dependent ramp rate and/or duration can be provided for the selected word line, for the first and/or second steps of the voltage increase. Moreover, for different word lines, we can use different ramp rates and/or durations.

Figure 15C:
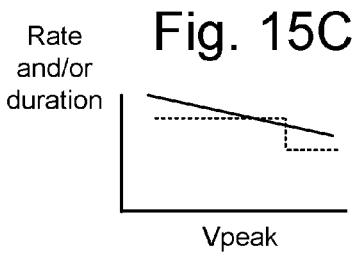
FIG. 15C depicts a plot of ramp rate and/or duration versus Vpeak.

FIG. 15C depicts a plot of ramp rate and/or duration versus Vpeak. As mentioned in connection with FIG. 14, the channel gradient is larger when the selected word line voltage, Vpeak, is larger. Accordingly, a stronger reduction in the ramp rate and/or duration can be used when Vpeak is relatively high to allow more time for the hot carriers to be absorbed and thereby reduce the likelihood of over-programming. One approach, represented by the solid line, gradually decreases the ramp rate and/or duration as Vpeak increases. Another approach, represented by the dashed line, decreases the ramp rate and/or duration in steps as Vpeak increases.

In this example, another increase (the second step increase, to Vpeak) causes the voltage of the selected word line to reach a peak level in the program loop; and the rate is relatively lower when the peak level is relatively higher.

Figure 15D:
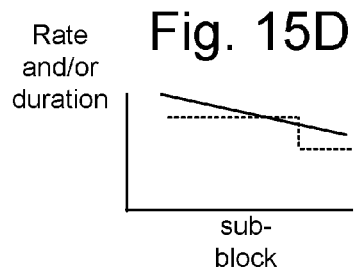
FIG. 15D depicts a plot of ramp rate and/or duration versus sub-block.

FIG. 15D depicts a plot of ramp rate and/or duration versus sub-block. As mentioned, over-programming can increase as the cells of a word line are subject to program voltages while different sub-blocks are programmed. Accordingly, a stronger reduction in the ramp rate and/or duration can be used when a selected string is in a sub-block which is programmed relatively later in the sub-block programming order. One approach, represented by the solid line, gradually decreases the ramp rate and/or duration for each successive sub-block which is programmed. Another approach, represented by the dashed line, decreases the ramp rate and/or duration in steps.

In this example, the set of word lines extend in multiple sub-blocks of memory cells; a control circuit is configured to program the sub-blocks in a sub-block programming order; and the rate is relatively lower when the selected string is in a sub-block which is programmed relatively later in the sub-block programming order.

FIG. 16A depicts an example scenario for ramp rate/duration. In FIG. 16A to 16E, the ramp rates/durations can apply to the voltages of the unselected word lines and to the first and/or second step voltages of the selected word line. Moreover, the memory cells of WL0 and WL1 are examples of one or more source-side data memory cells.

In FIG. 16A, the selected word line is WL0 or WL1. The ramp rate/duration for WL0 and WL1 is the same, e.g., 0.4×baseline. The ramp rate/duration for WL2-WL22 is the same, e.g., 0.8×baseline or baseline.

FIG. 16B depicts another example scenario for ramp rate/duration. The selected word line is WL0. The ramp rate/duration for WL1, e.g., 0.6×baseline, is higher than for WL0, e.g., 0.4×baseline. The ramp rate/duration for WL2-WL22 is higher than for WL0 and WL1, e.g., 0.8×baseline or baseline.

Referring to FIGS. 16B and 16C, when the group of one or more source-side data memory cells in a selected string comprises a first data memory cell which is at a source-side of the string and a second data memory cell which is adjacent to the first data memory cell; and the rate of the one increase (the first step increase) comprises a first value (0.4×baseline) when the selected memory cell is the first data memory cell (cell 927 of WL0 in FIG. 9B) and a second value (0.7×baseline), higher than the first value, when the selected memory cell is the second data memory cell (cell 926 of WL1 in FIG. 9B).

FIG. 16C depicts another example scenario for ramp rate/duration. The selected word line is WL1. The ramp rate/duration for WL1, e.g., 0.7×baseline, is higher than for WL0, e.g., 0.5×baseline. The ramp rate/duration for WL2-WL22 is higher than for WL0 and WL1, e.g., 0.9×baseline or baseline. The respective ramp rate/durations are higher in FIG. 16C than in FIG. 16B.

Referring to FIG. 16A to 16C, a control circuit is configured to increase a voltage of unselected word lines in the set of word lines concurrent with the one increase in the voltage of the selected word line; and a rate of the increase (e.g., 0.8×baseline, 0.9×baseline or baseline) in the voltage of the unselected word lines is greater than the rate of the one increase (the first step increase) (e.g., 0.4×baseline) when the selected memory cell is the first data memory cell and when the selected memory cell is the second data memory cell (e.g., 0.7×baseline).

FIG. 16D depicts another example scenario for ramp rate/duration. The selected word line is WL2-WL22. The ramp rate/duration for all word lines is the same, e.g., baseline. The respective ramp rate/durations are higher in FIG. 16D than in FIG. 16C.

Accordingly, it can be seen that, in one embodiment, an apparatus comprises: a set of word lines; a selected string comprising a set of data memory cells extending between a group of one or more source-side data memory cells at a source-side of the selected string and a drain-side data memory cell at a drain-side of the selected string; an unselected string of data memory cells extending between a group of one or more source-side data memory cells at a source-side of the unselected string and a drain-side data memory cell at a drain-side of the unselected string, wherein each word line in the set of word lines is connected to a respective data memory cell in the selected string and to a respective data memory cell in the unselected string; and a control circuit, the control circuit, to perform a program loop for a selected data memory cell in the set of data memory cells in the selected string, where the selected data memory cell is connected to a selected word line in the set of word lines, is configured to provide one increase and then another increase in a voltage of the selected word line, wherein at least one of a rate or a duration of the one increase is lower when the selected data memory cell is among the group of one or more source-side data memory cells in the selected string than when the selected data memory cell is not among the group of one or more source-side data memory cells in the selected string.

In another embodiment, a method comprises: providing one increase in a voltage of a selected word line in a set of word lines, the selected word line is connected to a selected data memory cell in a selected string and to an unselected data memory cell in an unselected string; and after the one increase, providing another increase in the voltage of the selected word line, wherein a rate of the one increase is lower when the selected data memory cell is among a group of one or more source-side data memory cells in the selected string than when the selected data memory cell is not among the group of one or more source-side data memory cells in the selected string.

In another embodiment, a memory device comprises means for performing each of the steps in the above-mentioned method. For example a memory device comprises: means for providing one increase in a voltage of a selected word line in a set of word lines, the selected word line is connected to a selected data memory cell in a selected string and to an unselected data memory cell in an unselected string; and means for, after the one increase, providing another increase in the voltage of the selected word line, wherein at least one of a rate or a duration of the one increase is relatively lower when the selected data memory cell is among a group of one or more source-side data memory cells in the selected string than when the selected data memory cell is not among the group of one or more source-side data memory cells in the selected string.

In another embodiment, a memory device comprises: a set of word lines; a selected string comprising a set of data memory cells extending between a source-side data memory cell at a source-side of the selected string and a drain-side data memory cell at a drain-side of the selected string, wherein each word line in the set of word lines is connected to a respective data memory cell in the selected string; and a control circuit, the control circuit, to perform a program loop for a selected data memory cell in the set of data memory, where the selected data memory cell is connected to a selected word line in the set of word lines, is configured to provide one increase and then another increase in a voltage of the selected word line, wherein at least one of a rate or a duration of the one increase is relatively lower when the selected data memory cell is the source-side data memory cell than when the selected data memory cell is not the source-side data memory cell.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of word lines;
a string comprising a set of data memory cells extending from a group of one or more source-side data memory cells at a source-side of the string to a drain-side data memory cell at a drain-side of the string, wherein the string is among a plurality of strings of memory cells; and
a control circuit, the control circuit, to perform a program loop for a selected data memory cell in the set of data memory cells in the string, where the selected data memory cell is connected to a selected word line in the set of word lines, is configured to provide one increase and then another increase in a voltage of the selected word line, wherein at least one of a rate or a duration of the one increase is lower when the selected data memory cell is among the group of one or more source-side data memory cells in the string than when the selected data memory cell is not among the group of one or more source-side data memory cells in the string.

2. The apparatus of claim 1, wherein:
the rate of the one increase is lower when the selected data memory cell is among the group of one or more source-side data memory cells in the string than when the selected data memory cell is not among the group of one or more source-side data memory cells in the string.

3. The apparatus of claim 2, wherein:
the control circuit is configured to increase a voltage of unselected word lines in the set of word lines concurrent with the one increase in the voltage of the selected word line at a rate which is higher than the rate of the one increase when the selected data memory cell is among the group of one or more source-side data memory cells in the string.

4. The apparatus of claim 1, wherein:
the duration of the one increase is smaller when the selected data memory cell is among the group of one or more source-side data memory cells in the string than when the selected data memory cell is not among the group of one or more source-side data memory cells in the string.

5. The apparatus of claim 4, wherein:
the control circuit is configured to increase a voltage of unselected word lines in the set of word lines concurrent with the one increase in the voltage of the selected word line for a duration which is longer than the duration of the one increase when the selected data memory cell is among the group of one or more source-side data memory cells in the string.

6. The apparatus of claim 1, wherein:
a maximum level reached by the voltage of the selected word line due to the one increase is lower when the selected data memory cell is among the group of one or more source-side data memory cells in the string than when the selected data memory cell is not among the group of one or more source-side data memory cells in the string.

7. The apparatus of claim 1, wherein:
the group of one or more source-side data memory cells in the string comprises a first data memory cell which is at a source-side of the string and a second data memory cell which is adjacent to the first data memory cell; and
the rate of the one increase comprises a first value when the selected memory cell is the first data memory cell and a second value, higher than the first value, when the selected memory cell is the second data memory cell.

8. The apparatus of claim 7, wherein:
the control circuit is configured to increase a voltage of unselected word lines in the set of word lines concurrent with the one increase in the voltage of the selected word line; and
a rate of the increase in the voltage of the unselected word lines is greater than the rate of the one increase when the selected memory cell is the first data memory cell and when the selected memory cell is the second data memory cell.

9. The apparatus of claim 1, wherein:
the rate of the one increase is relatively lower when a temperature is relatively higher.

10. The apparatus of claim 1, wherein:
the group of one or more source-side data memory cells in the string comprises no more than 10% of the data memory cells in the string.

11. The apparatus of claim 1, wherein:
the string extends vertically in a three-dimensional memory device; and
the string comprises a continuous polysilicon channel.

12. The apparatus of claim 1, wherein:
the group of one or more source-side data memory cells in the string is adjacent to a dummy memory cell at the source-side of the string;
the apparatus further comprises an unselected string of data memory cells extending from a group of one or more source-side data memory cells at a source-side of the unselected string to a drain-side data memory cell at a drain-side of the unselected string, wherein each word line in the set of word lines is connected to a respective data memory cell in the selected string and to a respective data memory cell in the unselected string; and
the group of one or more source-side data memory cells in the unselected string is adjacent to a dummy memory cell at the source-side of the unselected string.

13. The apparatus of claim 1, wherein:
the another increase causes the voltage of the selected word line to reach a peak level in the program loop; and the rate is relatively lower when the peak level is relatively higher.

14. The apparatus of claim 1, wherein:
the set of word lines extend in multiple sub-blocks of memory cells;
the control circuit is configured to program the sub-blocks in a sub-block programming order; and
the rate is relatively lower when the string is in a sub-block which is programmed relatively later in the sub-block programming order.

15. The apparatus of claim 1, wherein:
a rate of the another increase is lower when the selected data memory cell is among the group of one or more source-side data memory cells in the string than when the selected data memory cell is not among the group of one or more source-side data memory cells in the string.

16. A method, comprising:
providing one increase in a voltage of a selected word line in a set of word lines, the selected word line is connected to a selected data memory cell in a string; and
after the one increase, providing another increase in the voltage of the selected word line, wherein a rate of the one increase is lower when the selected data memory cell is among a group of one or more source-side data memory cells in the string than when the selected data memory cell is not among the group of one or more source-side data memory cells in the string.

17. The method of claim 16, wherein:
the one increase and the another increase are provided in each program loop of a plurality of program loops of a programming operation.

18. The method of claim 16, wherein:
the group of one or more source-side data memory cells in the string comprises a first data memory cell which is at a source-side of the string and a second data memory cell which is adjacent to the first data memory cell in the string; and
the rate of the one increase comprises a first value when the selected memory cell is the first data memory cell and a second value, higher than the first value, when the selected memory cell is the second data memory cell.

19. The method of claim 16, wherein:
a maximum level reached by the voltage of the selected word line due to the one increase is relatively lower when the selected data memory cell is among the group of one or more source-side data memory cells in the string than when the selected data memory cell is not among the group of one or more source-side data memory cells in the string.

20. An apparatus, comprising:
means for providing one increase in a voltage of a selected word line in a set of word lines, the selected word line is connected to a selected data memory cell in a string; and
means for, after the one increase, providing another increase in the voltage of the selected word line, wherein at least one of a rate or a duration of the one increase is relatively lower when the selected data memory cell is among a group of one or more source-side data memory cells in the string than when the selected data memory cell is not among the group of one or more source-side data memory cells in the string.

21. The apparatus of claim 20, wherein:
a rate of the another increase is lower when the selected data memory cell is among the group of one or more source-side data memory cells in the string than when the selected data memory cell is not among the group of one or more source-side data memory cells in the string.

\* \* \* \* \*